(12) United States Patent
Huang et al.

(10) Patent No.: US 8,901,551 B2
(45) Date of Patent: Dec. 2, 2014

(54) LIGHT EMITTING DIODE STRUCTURE AND MANUFACTURING METHOD THEREOF

(71) Applicants: Kuan-Chieh Huang, Tainan (TW); Tung-Lin Chuang, Tainan (TW)

(72) Inventors: Kuan-Chieh Huang, Tainan (TW); Tung-Lin Chuang, Tainan (TW)

(73) Assignee: Genesis Photonics Inc., Tainan (TW)

( * ) Notice: Subject to any disclaimer, the term of this patent is extended or adjusted under 35 U.S.C. 154(b) by 0 days.

(21) Appl. No.: 13/975,387

(22) Filed: Aug. 26, 2013

(65) Prior Publication Data
US 2014/0264389 A1    Sep. 18, 2014

(30) Foreign Application Priority Data
Mar. 18, 2013    (TW) ............... 102109549 A

(51) Int. Cl.
*H01L 51/00*    (2006.01)
*H01L 33/02*    (2010.01)
*H01L 51/50*    (2006.01)

(52) U.S. Cl.
CPC ............ *H01L 33/02* (2013.01); *H01L 51/5004* (2013.01)
USPC ............................... 257/40; 257/86; 257/103

(58) Field of Classification Search
CPC .. H01L 51/0034; H01L 51/50; H01L 51/5004
USPC .............. 257/40, 79, 86, 103; 438/48, 82, 99, 438/455, 458
See application file for complete search history.

*Primary Examiner* — Colleen A Matthews
*Assistant Examiner* — Quovaunda V Jefferson
(74) *Attorney, Agent, or Firm* — Jianq Chyun IP Office

(57) ABSTRACT

A light emitting diode (LED) structure including a substrate, a polymer layer, and an epitaxy layer is provided. The polymer layer is disposed on the substrate, wherein the polymer layer has a chemical formula of:

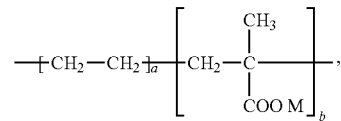

wherein M represents sodium, zinc, magnesium, or potassium. The epitaxy layer is disposed on the polymer layer. The epitaxy layer is bonded to the substrate via the polymer layer.

13 Claims, 3 Drawing Sheets

LIGHT EMITTING DIODE STRUCTURE AND MANUFACTURING METHOD THEREOF

CROSS-REFERENCE TO RELATED APPLICATION

This application claims the priority benefit of Taiwan application serial no. 102109549, filed on Mar. 18, 2013. The entirety of the above-mentioned patent application is hereby incorporated by reference herein and made a part of this specification.

BACKGROUND OF THE INVENTION

1. Field of the Invention

The invention is related to a semiconductor structure and a manufacturing method thereof, and more particularly, to a light emitting diode structure and a manufacturing method thereof.

2. Description of Related Art

In general, in the manufacturing method of the light emitting diode structure, an epitaxy layer is first grown on an epitaxy substrate. However, since the epitaxy substrate absorbs light, a wafer bonding method is needed to bond the epitaxy layer and a transparent transfer-substrate. Next, the epitaxy substrate is removed so the epitaxy layer may be transferred onto the transfer-substrate to avoid affecting light emission. Currently, the material of the adhesive layer used by the wafer bonding method includes silicon dioxide or benzocyclobutene (BCB). When a silicon dioxide layer is used as the adhesive layer, silicon dioxide needs to first be deposited on the transfer-substrate via plasma enhanced chemical vapor deposition (PECVD). Then, a polishing process and an activation process are performed on the deposited silicon dioxide layer to form a good bonding surface. Next, the epitaxy layer and the transfer-substrate are aligned, and the epitaxy layer and the transfer-substrate are bonded via a method of a high temperature (such as 300° C.) for a long time (such as 1 hour) and a high pressure (such as 3,000 N/cm$^2$). Lastly, the epitaxy substrate is removed to complete the manufacture of the light emitting diode.

When a benzocyclobutene layer is used as the adhesive layer, benzocyclobutene needs to first be coated on the epitaxy layer and the transfer-substrate via a spin coating method. Then, a baking procedure is performed on the coated benzocyclobutene. Next, the epitaxy layer and the transfer-substrate are aligned, and the epitaxy layer and the transfer-substrate are bonded via a method of a high temperature (such as 220° C.) for a long time (such as 3 hours) and a low pressure (such as 1,100 N/cm$^2$). Lastly, the epitaxy substrate is removed to complete the manufacture of the light emitting diode. However, the costs required for the two manufacturing methods are higher and the manufacturing steps are more complex. Moreover, since both materials require a high temperature for a long time to bond the epitaxy layer and the transfer-substrate, defects may be generated in the epitaxy layer and the quality thereof may be damaged due to the high temperature. Therefore, the luminous efficiency of the resulting light emitting diode structure may be affected.

SUMMARY OF THE INVENTION

The invention provides a light emitting diode structure and a manufacturing method thereof. The manufacturing method has the advantages of simple manufacturing process and low manufacturing cost.

The light emitting diode structure of the invention includes a substrate, a polymer layer, and an epitaxy layer. The polymer layer is disposed on the substrate, wherein the polymer layer has a chemical formula of:

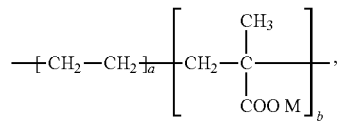

wherein M represents sodium, zinc, magnesium, or potassium. The epitaxy layer is disposed on the polymer layer. The epitaxy layer is bonded to the substrate via the polymer layer.

In an embodiment of the invention, the molecular weight of the polymer layer is between 10,000 g/mol and 120,000 g/mol.

In an embodiment of the invention, in the chemical formula, a is equal to 250 to 2,500 and b is equal to 10 to 300.

In an embodiment of the invention, the value of a/b is between 12 and 20.

In an embodiment of the invention, the substrate includes a sapphire substrate.

In an embodiment of the invention, the epitaxy layer includes a first-type semiconductor layer, a light emitting layer, and a second-type semiconductor layer. The second-type semiconductor layer is adjacent to the polymer layer. The light emitting layer is disposed between the first-type semiconductor layer and the second-type semiconductor layer.

The manufacturing method of the light emitting diode structure of the invention includes the following steps. An epitaxy layer is formed on an epitaxy substrate. A transfer-substrate is provided. A polymer layer is provided between the epitaxy layer of the epitaxy substrate and the transfer-substrate. The polymer layer has a chemical formula of:

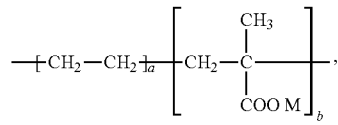

wherein M represents sodium, zinc, magnesium, or potassium. A bonding process is performed on the epitaxy layer and the transfer-substrate so that the epitaxy layer is bonded to the transfer-substrate via the polymer layer. The epitaxy substrate is removed to expose the epitaxy layer.

In an embodiment of the invention, the molecular weight of the polymer layer is between 10,000 g/mol and 120,000 g/mol.

In an embodiment of the invention, in the chemical formula, a is equal to 250 to 2,500 and b is equal to 10 to 300.

In an embodiment of the invention, the pressure applied in the bonding process is between 400 N/cm$^2$ and 4,500 N/cm$^2$.

In an embodiment of the invention, the temperature of the bonding process is between 90° C. and 200° C.

In an embodiment of the invention, the time of the bonding process is between 1 minute and 360 minutes.

In an embodiment of the invention, the steps of forming the epitaxy layer include, in order, forming a first-type semiconductor layer, a light emitting layer, and a second-type semiconductor layer on the epitaxy substrate.

Based on the above, since the polymer layer used in the invention does not need a high temperature to bond the epitaxy layer and the transfer-substrate, i.e., the ionic bonding of the polymer layer can be used to obtain the bonding performance. Therefore, the reliability of interface bonding between the substrate (transfer-substrate) and the epitaxy layer of the invention is better, and the light emitting diode structure of the invention is not damaged due to high temperature and therefore may have better luminous efficiency. On the other hand, since the polymer layer of the invention has the advantages of low cost and forming without a complex semiconductor manufacturing process, the manufacturing method of the light emitting diode structure of the invention may also have lower manufacturing cost and reduce the steps of the manufacturing process.

To make the above features and advantages of the present invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of the specification. The drawings illustrate embodiments of the invention and, together with the description, serve to explain the principles of the invention.

DESCRIPTION OF THE EMBODIMENTS

Figure 1:
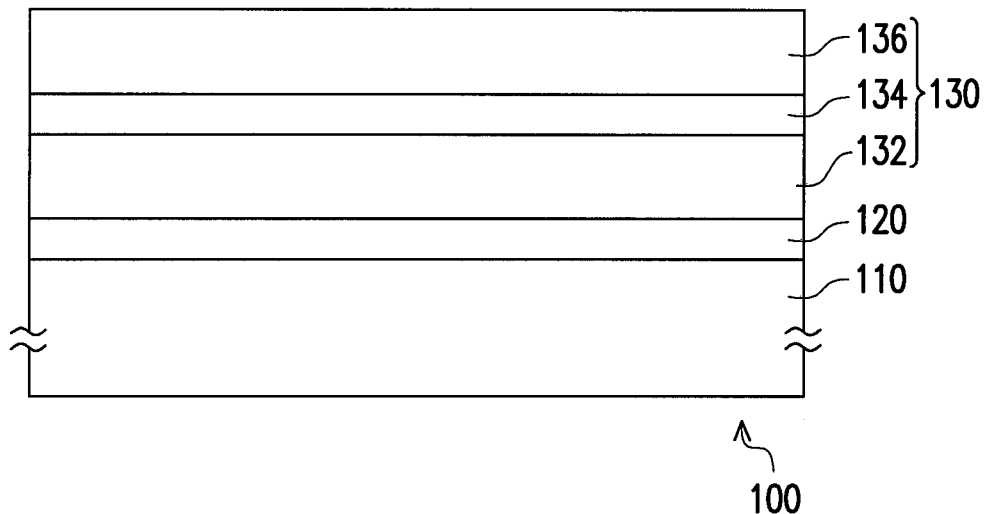
FIG. 1 is a schematic cross-sectional diagram illustrating a light emitting diode structure of the invention.

FIG. 1 is a schematic cross-sectional diagram illustrating a light emitting diode structure of the invention. Referring to FIG. 1, in the present embodiment, the light emitting diode structure 100 includes a substrate 110, a polymer layer 120, and an epitaxy layer 130. The polymer layer 120 is disposed on the substrate 110, wherein the polymer layer 120 has a chemical formula of:

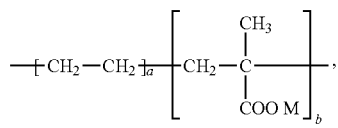

wherein M represents sodium, potassium, magnesium, or zinc. The epitaxy layer 130 is disposed on the polymer layer 120, and the epitaxy layer 130 is bonded to the substrate 110 via the polymer layer 120.

More specifically, the substrate 110 of the present embodiment is, for instance, a sapphire substrate, but is not limited thereto. The molecular weight of the polymer layer 120 is, for instance, between 10,000 g/mol and 120,000 g/mol. Furthermore, when the molecular weight of the polymer layer 120 is less than 10,000, the mechanical strength is insufficient; when the molecular weight is greater than 120,000, the manufacturing process is less easy to manipulate. Moreover, in the chemical formula, a is, for instance, 250 to 2,500 and b is, for instance, 10 to 300. When the ratio of a and b, that is, when the value of a/b, is less than 12, the degree of bonding of the —$CH_2$—$CH_2$— in the chemical formula is insufficient. As a result, the physical properties, chemical properties, and the mechanical strength of the polymer layer 120 are insufficient; when the value of a/b is greater than 20, the content of the activated functional group COOM is too small. As a result, the bonding force of each of the polymer layer 120 and the epitaxy layer 130 is insufficient. Therefore, in the present embodiment, the value of a/b is preferably between 12 and 20.

Furthermore, the thickness of the polymer layer 120 is, for instance, between 10 microns and 200 microns, and the polymer layer 120 is, for instance, polymerized from monomers such as ethylene, acrylic acid, zinc salt, sodium salt, and lithium salt. Moreover, the epitaxy layer 130 is composed of, for instance, a second-type semiconductor layer 132, a light emitting layer 134, and a first-type semiconductor layer 136. In general, the first-type semiconductor layer 136 is an n-type semiconductor layer, the second-type semiconductor layer 132 is a p-type semiconductor layer, and the light emitting layer 134 is a structure such as a homo junction, a hetero junction, a double hetero-junction, a single quantum well, or a multiple quantum well. The second-type semiconductor layer 132 is adjacent to the polymer layer 120, and the light emitting layer 134 is disposed between the second-type semiconductor layer 132 and the first-type semiconductor layer 136.

Since the light emitting diode structure 100 of the present embodiment uses the polymer layer 120 to bond the substrate 110 and the epitaxy layer 130, the polymer layer 120 has the characteristic of good bonding force. Therefore, the reliability of interface bonding between the substrate 110 and the epitaxy layer 130 is better. As a result, the light emitting diode structure 100 of the present embodiment may have a better luminous efficiency.

The above only introduces the light emitting diode structure 100 of the invention, and does not introduce the manufacturing method of the light emitting diode structure 100 of the invention. In this regard, the manufacturing method of the light emitting diode structure 100a is explained in an embodiment below, and FIG. 2A to FIG. 2D are used in conjunction to explain the manufacturing method of the light emitting diode structure 100a in detail.

FIG. 2A to FIG. 2D are schematic cross-sectional diagrams illustrating a manufacturing method of a light emitting diode structure of an embodiment of the invention. The present embodiment follows the reference numerals for components and parts of the content of the above embodiment, wherein the same reference numerals are used to represent the same or similar components. Moreover, description of the same technical content is omitted. The description of the omitted part may be referred to in the previous embodiment and is not repeated in the present embodiment.

Figure 2A:
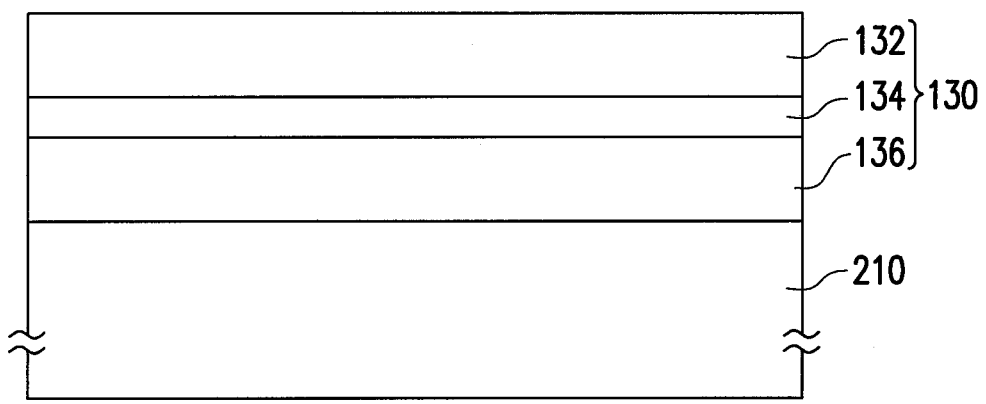
FIG. 2A to FIG. 2D are schematic cross-sectional diagrams illustrating a manufacturing method of a light emitting diode structure of an embodiment of the invention.

Referring first to FIG. 2A, according to the manufacturing method of the light emitting diode structure 100a of the present embodiment, an epitaxy layer 130 is first formed on an epitaxy substrate 210. In particular, the steps of forming the epitaxy layer 130 include, in order, forming a first-type semiconductor layer 136, a light emitting layer 134, and a second-type semiconductor layer 132 on the epitaxy substrate 210. The first-type semiconductor layer 136 is, for instance, an n-type semiconductor layer, the second-type semiconductor layer 132 is, for instance, a p-type semiconductor layer, and the light emitting layer 134 is, for instance, a multiple quantum well structure. Here, the epitaxy substrate 210 is, for instance, a gallium arsenide substrate, a silicon substrate, or a gallium nitride substrate, but is not limited thereto.

Figure 2B:
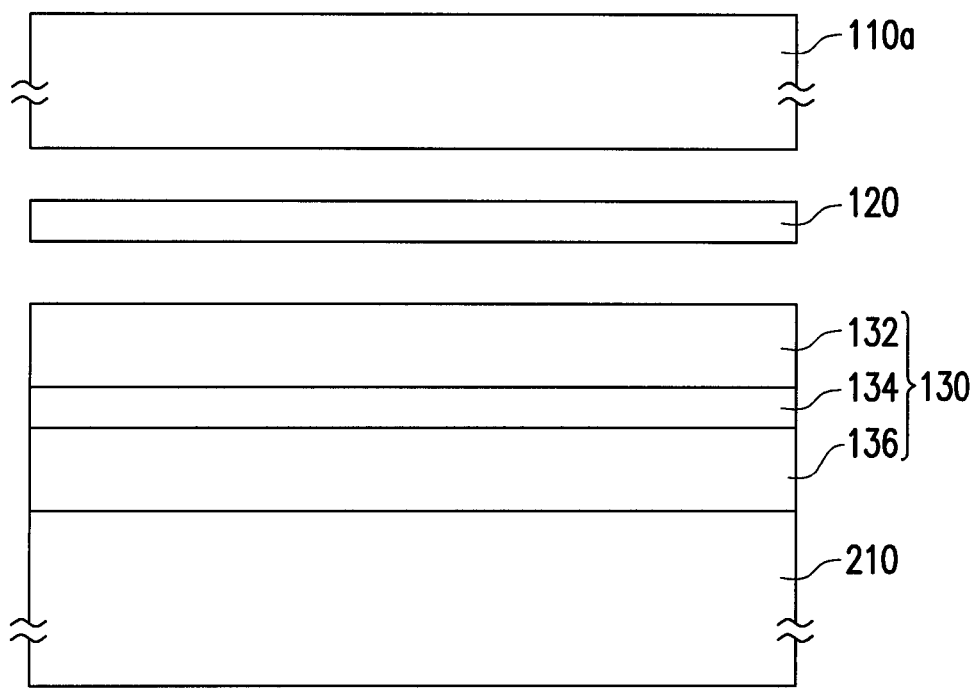

Then, referring to FIG. 2B, a transfer-substrate 110a and a polymer layer 120 are provided, wherein the polymer layer 120 is disposed between the epitaxy layer 130 of the epitaxy substrate 210 and the transfer-substrate 110a. In particular, the polymer layer 120 has a chemical formula of:

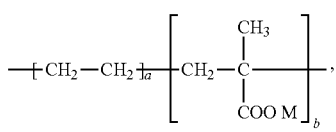

wherein in the chemical formula, a is, for instance, 250 to 2,500, b is, for instance, 10 to 300, and M represents sodium, potassium, magnesium, or zinc. Moreover, the molecular weight of the polymer layer 120 of the present embodiment is, for instance, between 10,000 g/mol and 120,000 g/mol. Here, the transfer-substrate 110a is, for instance, a sapphire substrate, but is not limited thereto. The thickness of the polymer layer 120 is, for instance, between 10 microns and 200 microns, and the polymer layer 120 is, for instance, polymerized from monomers such as ethylene, acrylic acid, zinc salt, sodium salt, and lithium salt. In particular, the polymer layer 120 may be, for instance, a paper sheet having the characteristics of flexibility and cutting easily that does not require complex processes of depositing or coating to obtain the desired size for bonding, which facilitates the execution of subsequent bonding processes.

Figure 2C:
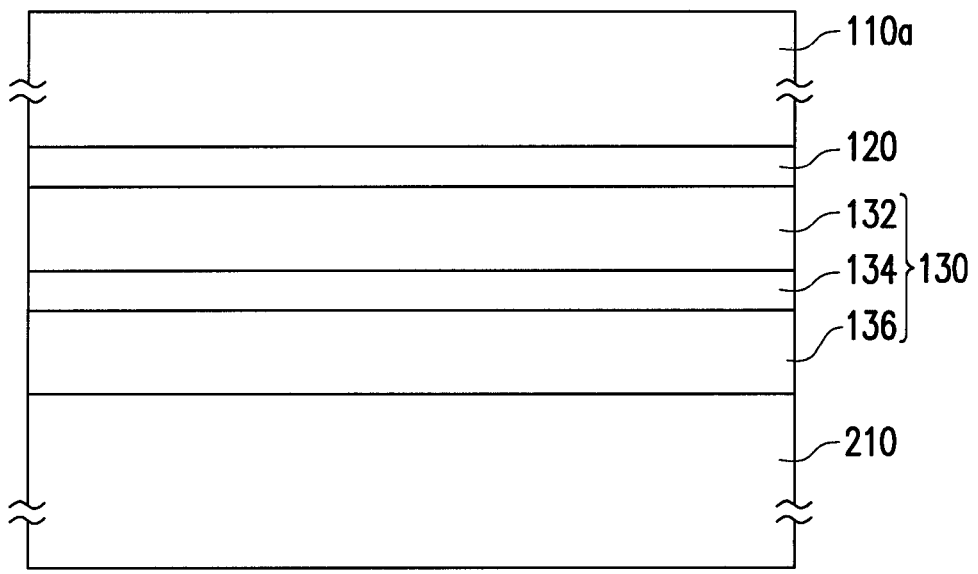

Then, referring to FIG. 2C, a bonding process is performed on the epitaxy layer 130 and the transfer-substrate 110a so that the epitaxy layer 130 is bonded to the transfer-substrate 110a via the polymer layer 120. At this point, the polymer layer 120 and the epitaxy layer 130 are located between the epitaxy substrate 210 and the transfer-substrate 110a. In the present embodiment, the pressure applied in the bonding process is, for instance, between 400 N/cm$^2$ and 4,500 N/cm$^2$, and is preferably 2,000 N/cm$^2$. The temperature of the bonding process is, for instance, between 90° C. and 200° C., and is preferably 150° C. The time of the bonding process is, for instance, between 1 minute and 360 minutes, and is preferably 30 minutes.

Figure 2D:
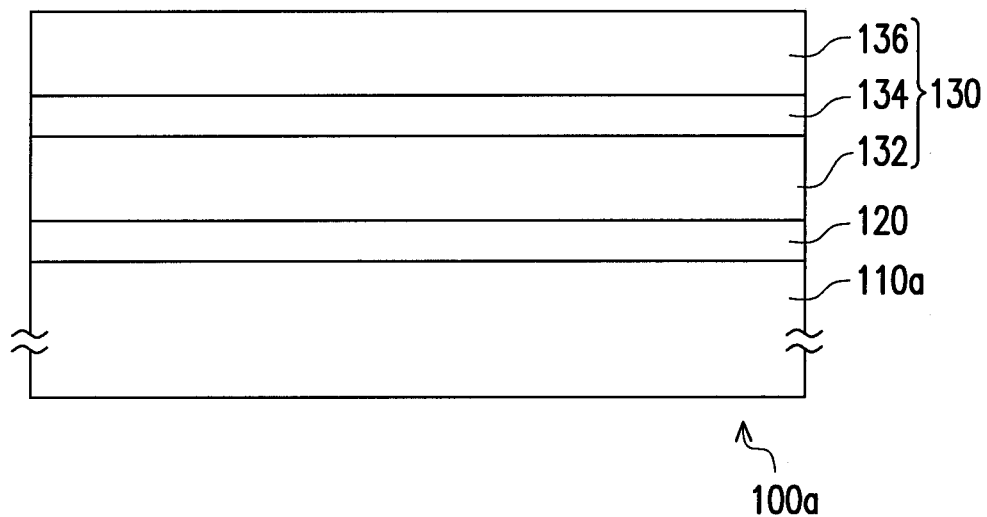

Lastly, referring to FIG. 2D, the epitaxy substrate 210 is removed to expose the epitaxy layer 130. At this point, the polymer layer 120 and the second-type semiconductor layer 132, the light emitting layer 134, and the first-type semiconductor layer 136 of the epitaxy layer 130 are stacked on the transfer-substrate 110a in order. At this point, the manufacture of the light emitting diode package structure 100a is complete.

In the present embodiment, the polymer layer 120 is used as an adhesive layer to bond the transfer-substrate 110a and the epitaxy layer 130. Therefore, in comparison to the known method that uses a silicon dioxide layer or a benzocyclobutene layer as the adhesive layer and requires a high temperature (such as 300° C. or 220° C.) for a long time (such as 1 hour or 3 hours) to bond the epitaxy substrate and the transfer-substrate, the present embodiment only needs a low temperature (such as 150° C.) for a short time (such as 30 minutes) to achieve a bonding effect. Moreover, since the polymer layer 120 has the characteristics of flexibility and cutting easily, complex semiconductor processes do not need to be performed to form the polymer layer 120 on the transfer-substrate 110a. As a result, the manufacturing method of the light emitting diode structure 100a of the present embodiment may effectively reduce the process time, lower the manufacturing cost, and reduce the process steps.

Based on the above, in the invention, since a polymer layer having the characteristic of good bonding properties is used to bond the substrate and the epitaxy layer, the reliability of interface bonding between the substrate and the epitaxy layer is better. As a result, the light emitting diode structure of the invention has better luminous efficiency. Moreover, in comparison to the known method that uses a silicon dioxide layer or a benzocyclobutene layer as the adhesive layer and requires a high temperature for a long time to bond the epitaxy substrate and the transfer-substrate, the polymer layer used in the invention may achieve a bonding effect via a low temperature for a short time. Moreover, the polymer layer has the characteristics of flexibility and cutting easily. As a result, the manufacturing method of the light emitting diode structure of the invention may effectively reduce the process time, lower the manufacturing cost, and reduce the process steps.

Although the invention has been described with reference to the above embodiments, it will be apparent to one of the ordinary skill in the art that modifications to the described embodiments may be made without departing from the spirit of the invention. Accordingly, the scope of the invention is defined by the attached claims not by the above detailed descriptions.

What is claimed is:

1. A light emitting diode structure, comprising:

a substrate;

a polymer layer disposed on the substrate, wherein the polymer layer has a chemical formula of:

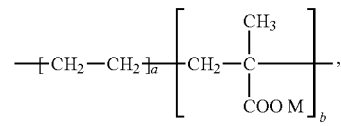

wherein M represents sodium, zinc, magnesium, or potassium; and an epitaxy layer disposed on the polymer layer, wherein the epitaxy layer is bonded to the substrate via the polymer layer.

2. The light emitting diode structure as recited in claim 1, wherein a molecular weight of the polymer layer is between 10,000 g/mol and 120,000 g/mol.

3. The light emitting diode structure as recited in claim 1, wherein in the chemical formula, a is equal to 250 to 2,500 and b is equal to 10 to 300.

4. The light emitting diode structure as recited in claim 1, wherein a value of a/b is between 12 and 20.

5. The light emitting diode structure as recited in claim 1, wherein the substrate comprises a sapphire substrate.

6. The light emitting diode structure as recited in claim 1, wherein the epitaxy layer comprises a first-type semiconductor layer, a light emitting layer, and a second-type semiconductor layer, and the second-type semiconductor layer is adjacent to the polymer layer and the light emitting layer is disposed between the first-type semiconductor layer and the second-type semiconductor layer.

7. A manufacturing method of a light emitting diode structure, comprising:

forming an epitaxy layer on an epitaxy substrate;

providing a transfer-substrate;

providing a polymer layer between the epitaxy layer of the epitaxy substrate and the transfer-substrate, wherein the polymer layer has a chemical formula of:

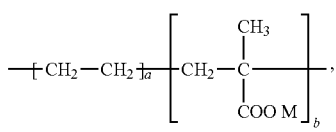

wherein M represents sodium, zinc, magnesium, or potassium;

performing a bonding process on the epitaxy layer and the transfer-substrate so that the epitaxy layer is bonded to the transfer-substrate via the polymer layer; and removing the epitaxy substrate to expose the epitaxy layer.

8. The manufacturing method of the light emitting diode structure as recited in claim 7, wherein a molecular weight of the polymer layer is between 10,000 g/mol and 120,000 g/mol.

9. The manufacturing method of the light emitting diode structure as recited in claim 7, wherein in the chemical formula, a is equal to 250 to 2,500 and b is equal to 10 to 300.

10. The manufacturing method of the light emitting diode structure as recited in claim 7, wherein a pressure applied in the bonding process is between 400 N/cm$^2$ and 4,500 N/cm$^2$.

11. The manufacturing method of the light emitting diode structure as recited in claim 7, wherein a temperature of the bonding process is between 90° C. and 200° C.

12. The manufacturing method of the light emitting diode structure as recited in claim 7, wherein a time of the bonding process is between 1 minute and 360 minutes.

13. The manufacturing method of the light emitting diode structure as recited in claim 7, wherein the steps of forming the epitaxy layer comprise, in order, forming a first-type semiconductor layer, a light emitting layer, and a second-type semiconductor layer on the epitaxy substrate.

* * * * *